US009005698B2

(12) United States Patent
Haider

(10) Patent No.: US 9,005,698 B2
(45) Date of Patent: Apr. 14, 2015

(54) PIEZOELECTRIC THIN FILM PROCESS

(75) Inventor: Asad Mahmood Haider, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 505 days.

(21) Appl. No.: 13/340,093

(22) Filed: Dec. 29, 2011

(65) Prior Publication Data

US 2012/0171364 A1  Jul. 5, 2012

Related U.S. Application Data

(60) Provisional application No. 61/427,973, filed on Dec. 29, 2010.

(51) Int. Cl.
  *H01L 41/22*  (2013.01)
  *H01L 27/20*  (2006.01)
  *H01L 41/187* (2006.01)
  *H01L 41/318* (2013.01)

(52) U.S. Cl.
  CPC ............ *H01L 27/20* (2013.01); *H01L 41/1875* (2013.01); *H01L 41/318* (2013.01)

(58) Field of Classification Search
  CPC ................................... H01L 4/22; B05D 3/02

USPC .................. 427/379, 380, 226, 229, 100, 444
See application file for complete search history.

(56) References Cited

U.S. PATENT DOCUMENTS

| 5,028,455 | A | * | 7/1991 | Miller et al. | ................ 427/126.3 |
| 5,728,626 | A | * | 3/1998 | Allman et al. | ................ 438/608 |
| 2004/0129918 | A1 | * | 7/2004 | Eritate et al. | ............. 252/62.9 R |

* cited by examiner

*Primary Examiner* — Michael Cleveland
*Assistant Examiner* — Tabassom Tadayyon Eslami
(74) *Attorney, Agent, or Firm* — Jacqueline J. Garner; Frank Cimino

(57) ABSTRACT

A process of forming an integrated circuit containing a piezoelectric thin film by forming a sol gel layer, drying in at least 1 percent relative humidity, baking starting between 100 and 225° C. increasing to between 275 and 425° C. over at least 2 minutes, and forming the piezoelectric thin film by baking the sol gel layer between 250 and 350° C. for at least 20 seconds, annealing between 650 and 750° C. for at least 60 seconds in an oxidizing ambient pressure between 700 and 1000 torr and a flow rate between 3 and 7 slm, followed by annealing between 650 and 750° C. for at least 20 seconds in a pressure between 4 and 10 torr and a flow rate of at least 5 slm, followed by ramping down the temperature.

11 Claims, 5 Drawing Sheets

PIEZOELECTRIC THIN FILM PROCESS

This application claims the benefit of U.S. Provisional Application No. 61/427,973, filed Dec. 29, 2010, the entirety of which is herein incorporated by reference.

FIELD OF THE INVENTION

This invention relates to the field of integrated circuits. More particularly, this invention relates to ferroelectric layers in integrated circuits.

BACKGROUND OF THE INVENTION

An integrated circuit may include components with a ferroelectric thin film, such as lead zirconium titanate or lead lanthanum zirconium titanate. Ferroelectric thin films may be used, for example, as dielectric layers in capacitors of nonvolatile memory cells. Ferroelectric thin films may be formed from a sol gel solution, which is a mixture of metal-organic chemicals in solvent. Forming ferroelectric thin films from sol gel solutions with desired structural integrity, thickness, breakdown voltage, leakage current density may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a ferroelectric film may be formed by a process including dispensing sol gel solution onto a wafer which will contain the integrated circuit to form a sol gel layer, spinning the wafer to distribute the sol gel solution so as to form a sol gel layer, and drying the sol gel layer so as to prevent radial edge spikes. The sol gel layer is baked in a non-reducing ambient so that temperature increases with time during the bake so as to remove at least 90 percent of organics from the sol gel layer. These steps may be repeated to form a thicker sol gel layer. The sol gel layer is annealed in an oxidizing ambient by a process including an initial ramped bake to remove residual volatiles, a crystallization anneal at high pressure in an oxidizing ambient while spinning the wafer, followed by a second crystallization anneal at low pressure and high ambient flow while spinning the wafer, followed by a temperature ramp down step.

DETAILED DESCRIPTION OF EXAMPLE EMBODIMENTS

Figure 1:
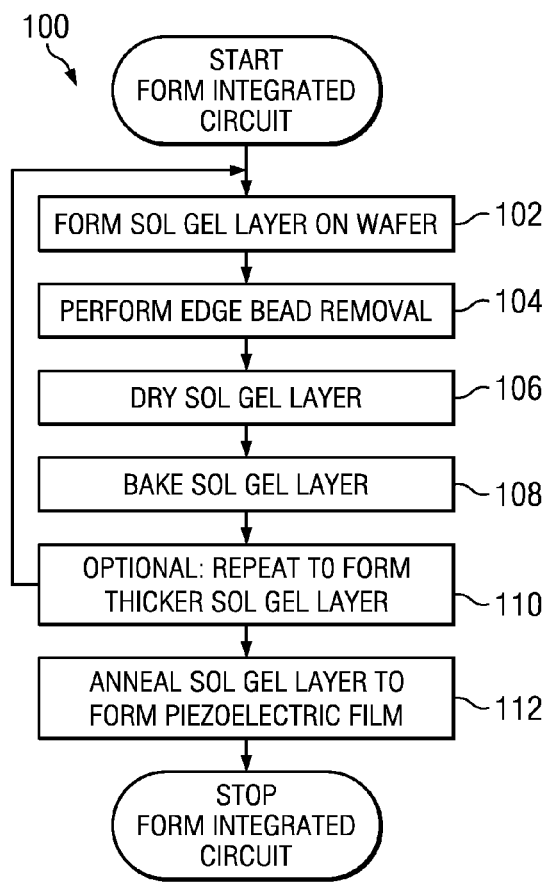
FIG. 1 is a flowchart of a process of forming an integrated circuit containing a ferroelectric film.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purpose of this specification, the term "percent relative humidity" is understood to mean a percentage of water vapor relative to a saturated ambient, at a specified temperature. For example, an ambient with 100 percent relative humidity at 25° C. would have 23.76 torr water vapor pressure, which corresponds to 23.0 grams of water per cubic meter of ambient. Similarly, an ambient with 1 percent relative humidity at 25° C. would have 0.24 torr water vapor pressure, which corresponds to 0.23 grams of water per cubic meter of ambient.

An integrated circuit containing a ferroelectric film may be formed by a process including dispensing sol gel solution onto a wafer which will contain the integrated circuit to form a sol gel layer, spinning the wafer to distribute the sol gel solution so as to form a sol gel layer, performing an edge bead removal process using an edge bead removal solvent which is immiscible in the sol gel layer, and drying the sol gel layer so as to prevent radial edge spikes. The sol gel layer is baked in a non-reducing ambient so that temperature increases with time during the bake so as to remove at least 90 percent of organics from the sol gel layer. These steps may be repeated to form a thicker sol gel layer. The sol gel layer is annealed by a process including an initial ramped bake in an oxidizing ambient to remove volatiles, a crystallization anneal at high pressure in an oxidizing ambient while spinning the wafer, followed by a second crystallization anneal at low pressure and high ambient flow while spinning the wafer, followed by a temperature ramp down step.

Sol gel solution is a mixture of metal-organic chemicals in solvent. In one example, a sol gel solution used to form a lead zirconium titanate (PZT) ferroelectric thin film may start with lead acetate trihydrate, titanium isopropoxide, zirconium n-propoxide, and 2-methoxyethanol solvent. The sol gel solution might be prepared by drying the lead acetate trihydrate and mixing it with a portion of the 2-methoxyethanol followed by heating, while separately mixing the titanium isopropoxide and zirconium n-propoxide with another portion of the 2-methoxyethanol followed by heating, and subsequently mixing the lead acetate mixture with the titanium isopropoxide and zirconium n-propoxide mixture, followed by dilution with organic solvents. Relative amounts of the titanium isopropoxide and zirconium n-propoxide may be adjusted to provide a desired ratio of titanium to zirconium in the PZT ferroelectric thin film.

In another example, a sol gel solution used to form a lead lanthanum zirconium titanate (PLZT) ferroelectric thin film may start with lanthanum acetate hydrate in addition to lead acetate trihydrate, titanium isopropoxide and zirconium n-propoxide. The sol gel solution may include excess lead, possibly 10 percent excess, to compensate for lead loss during the anneal operation.

Sol gel solutions prepared by other means are within the scope of the instant invention. Sol gel solutions are commercially available having relative concentrations of metals to provide a desired stoichiometry of the ferroelectric thin film.

FIG. 1 is a flowchart of a process of forming an integrated circuit containing a ferroelectric film. The process 100 begins with step 102 to form a sol gel layer on a wafer which will contain the integrated circuit. Details of step 102 will be discussed in reference to FIG. 2 and FIG. 3.

Subsequent to forming the sol gel layer on the wafer, step 104 is to perform an edge bead removal operation on the sol gel layer, in which sol gel material is removed from an edge of the wafer. Details of step 104 will be discussed in reference to FIG. 4 and FIG. 5.

Subsequent to performing the edge bead removal operation, step 106 is to dry the sol gel layer, so as to remove a portion of solvents from the sol gel layer. Details of drying the sol gel layer will be discussed in reference to FIG. 4 and FIG. 6.

Subsequent to drying the sol gel layer, step 108 is to bake the sol gel layer so as to remove at least 90 percent of remaining solvents from the sol gel layer. Details of baking the sol gel layer are discussed in reference to FIG. 7 and FIG. 8.

Steps 102 through 108 may be repeated to form a thicker sol gel layer, as depicted in FIG. 1 by step 110. A second sol gel layer is formed by dispensing a second portion of sol gel solution on a top surface of the first sol gel layer and repeating steps 102 through 108. In one version of the instant embodiment, steps 102 through 108 may be performed between five and twelve times.

After the sol gel layer has been completely formed, step 112 is to anneal the sol gel layer to form a crystalline ferroelectric thin film. Details of annealing the sol gel layer are discussed in reference to FIG. 9 and FIG. 10.

Figure 2:
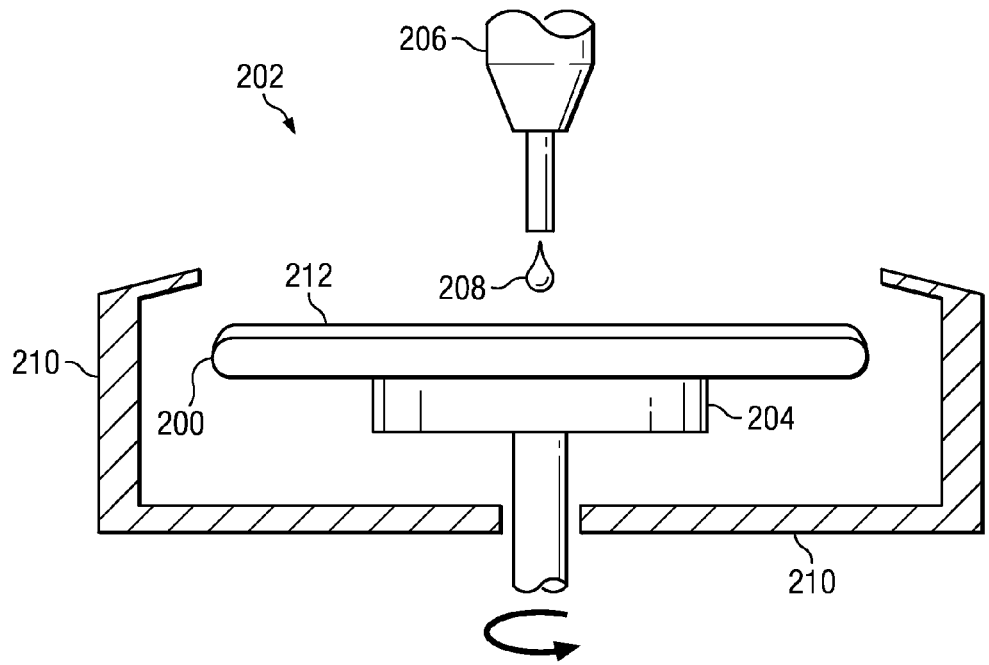
FIG. 2 depicts a wafer in a spin coat apparatus for forming a sol gel layer on the wafer.

FIG. 2 depicts a wafer in a spin coat apparatus for forming a sol gel layer on the wafer. The wafer 200 is disposed in the spin coat apparatus 202 on a rotating chuck 204 capable of spinning the wafer 200 up to several thousand revolutions per minute (rpm). The spin coat apparatus 202 includes a sol gel dispense head 206 which delivers sol gel solution to a top surface of the wafer 200, as depicted schematically in FIG. 2 by a dispensed sol gel dose 208. The spin coat apparatus 202 may include a spinner bowl 210 to control excess sol gel solution. The dispensed sol gel solution on the top surface of the wafer 200 is distributed over the top surface of the wafer by rotating the chuck 204 to form a sol gel layer 212.

Figure 3:
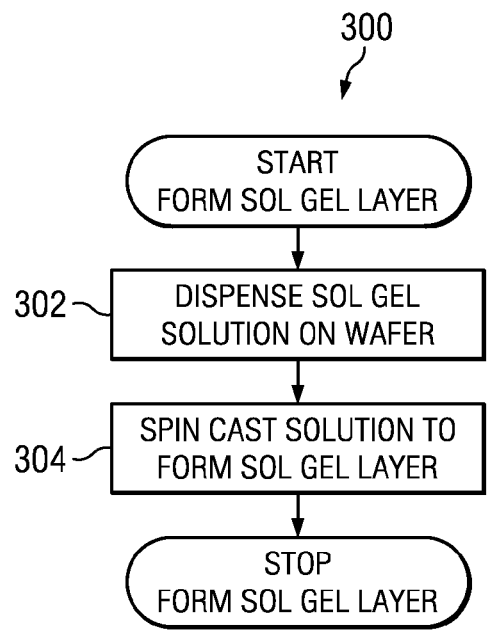
FIG. 3 is a flowchart of a process to form the sol gel layer on the top surface of the wafer as depicted in FIG. 2.

FIG. 3 is a flowchart of a process to form the sol gel layer on the top surface of the wafer as depicted in FIG. 2. The sol gel layer forming process 300 begins with step 302 to dispense a portion of the sol gel solution 208 onto the top surface of the wafer 200. In one version of step 302, 2 cm³ of sol gel solution 208 may be dispensed onto a 200 mm wafer 200. In one version of step 302, the chuck 204 may spin the wafer 200 between 500 rpm and 1500 rpm as the sol gel solution 208 is dispensed.

Subsequent to dispensing the sol gel solution 208, step 304 is to spin the wafer to form the sol gel layer 212 on the top surface of the wafer 200 with a thickness in a desired range. In one version of step 304, a 200 mm wafer 200 may be spun between 1500 rpm and 3500 rpm to form the sol gel layer 212. Spin speeds and accelerations in step 304 may be selected to provide a desired thickness and uniformity while avoiding radial striations. Step 304 may be referred to as a casting operation. A portion of solvents in the sol gel layer 212 may be removed during the casting operation. During the casting operation, water vapor in an ambient over the wafer 200 may react with the sol gel layer 212 in a gelation reaction to form a gel.

Figure 4:
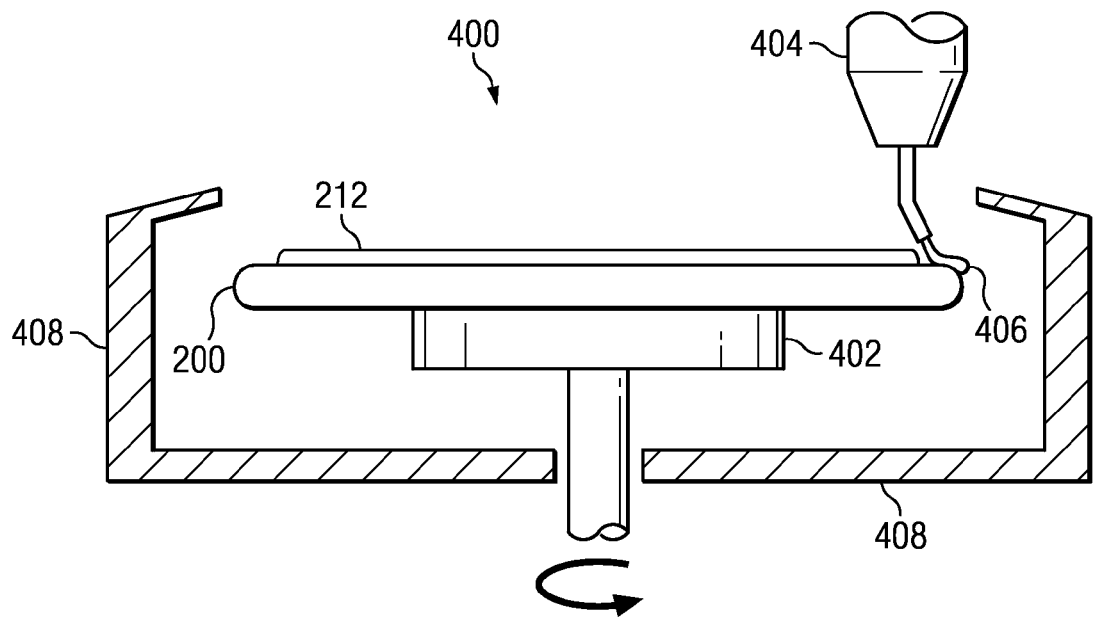
FIG. 4 depicts the wafer in an edge bead removal apparatus, which may possibly be the spin coat apparatus of FIG. 2.

FIG. 4 depicts the wafer 200 in an edge bead removal apparatus 400, which may possibly be the spin coat apparatus 202 of FIG. 2. The wafer 200 with the sol gel layer 212 is disposed in the edge bead removal apparatus 400 on a rotating chuck 402, which may be the chuck 204 in the spin coat apparatus 202. The edge bead removal apparatus 400 includes an edge bead removal solvent dispense head 404 which delivers edge bead removal solvent to an outer edge of the wafer 200 as the wafer 200 is rotated, as depicted schematically in FIG. 4 by dispensed edge bead removal solvent 406. The edge bead removal apparatus 400 may include a spinner bowl 408 to collect edge bead removal solvent.

A drying operation is also performed in the edge bead removal apparatus 400 to remove more solvent from the sol gel layer 212. During the drying operation, the wafer 200 is spun, for example between 800 rpm and 2500 rpm for a 200 mm wafer 200. A non-reducing ambient, not shown, is provided over the sol gel layer 212 during the drying operation.

Figure 5:
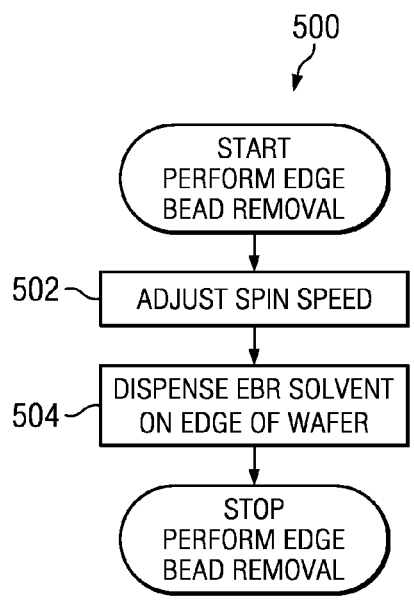
FIG. 5 is a flowchart of an edge bead removal process performed in the edge bead removal apparatus of FIG. 4.

FIG. 5 is a flowchart of an edge bead removal process 500 performed in the edge bead removal apparatus 400 of FIG. 4. The edge bead removal process 500 begins with step 502 to adjust the spin speed of the wafer 200. Subsequently, step 504 is to dispense edge bead removal solvent 406 from the solvent dispense head 404 onto the outer edge of the wafer 200. The dispensed edge bead removal solvent 406 removes sol gel material from an edge band, commonly between 2 and 10 mm wide, at the outer edge of the wafer 200. The edge bead removal solvent 406 is selected to be immiscible in the sol gel material. In one version of the instant embodiment, the edge bead removal solvent 406 may be at least 99 percent water. A spin speed of the wafer is selected to provide adequate removal of the sol gel material without undercutting the sol gel layer 212. In one version of the instant embodiment, a 200 mm wafer 200 may be spun between 1500 rpm and 3000 rpm while the edge bead removal solvent 406 is dispensed.

Figure 6:
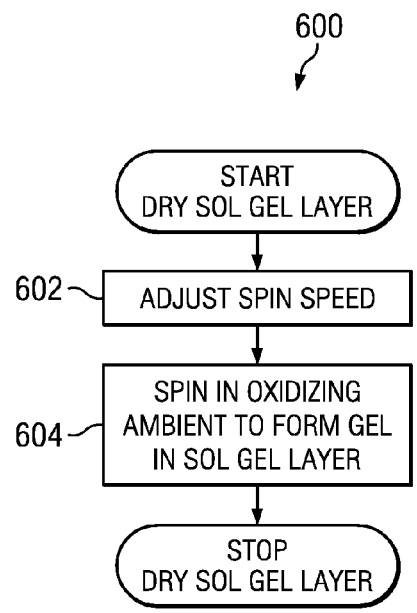
FIG. 6 is a flowchart of a sol gel layer dry process performed in the edge bead removal apparatus of FIG. 4.

FIG. 6 is a flowchart of a sol gel layer dry process 600 performed in the edge bead removal apparatus 400 of FIG. 4. The dry process 600 begins with step 602 to adjust the spin speed of the wafer 200. Subsequently, step 604 is to spin the wafer 200 in the non-reducing ambient for at least 5 seconds. The non-reducing ambient in the dry process 600 has at least 1 percent relative humidity at 25° C. A flow rate of the non-reducing ambient may be between 300 cm³/minute and 1000 cm³/minute. In one version of the instant embodiment, the non-reducing ambient may include at least 1 percent oxygen. In another version, the non-reducing ambient may include at least 20 percent oxygen. In one version of the instant embodiment, the spin speed of a 200 mm wafer 200 during step 604 may be between 800 rpm and 2500 rpm. A further portion of solvent in the sol gel layer 212 may be removed during step

604. Oxidizing agents in the ambient may react with the sol gel layer 212 to form more gel.

Figure 7:
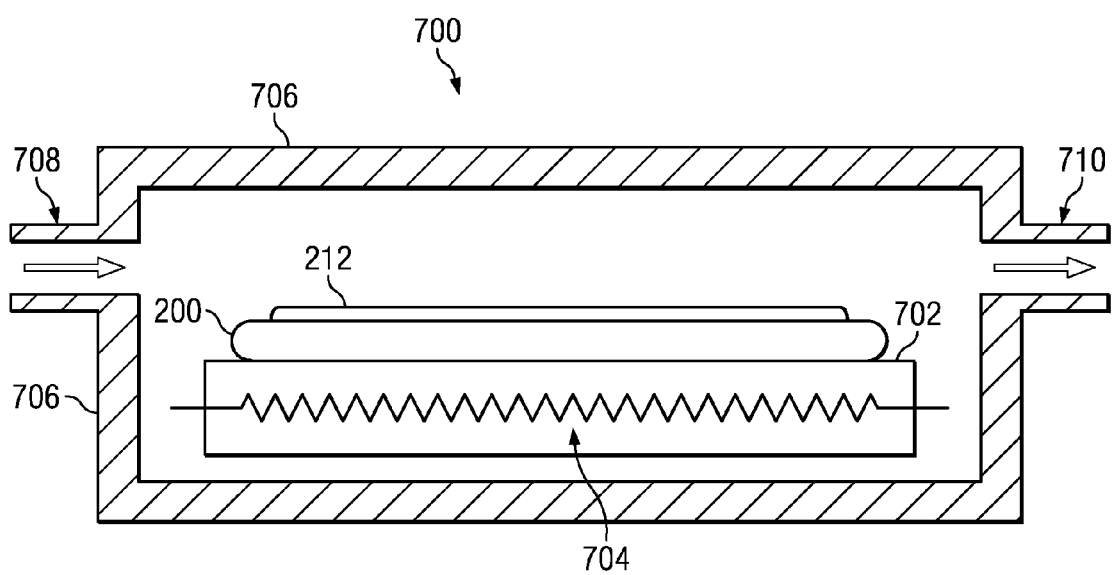
FIG. 7 depicts the wafer in a sol gel layer bake apparatus.

FIG. 7 depicts the wafer 200 in a sol gel layer bake apparatus 700. The wafer 200 with the sol gel layer 212 is disposed on a bake chuck 702. Heat is applied to the wafer 200, for example by heating the bake chuck 702 with a heater element 704 as depicted in FIG. 7. Other means of heating the wafer 200 are within the scope of the instant embodiment. The sol gel layer bake apparatus 700 includes a bake chamber 706 with an inlet port 708 and an outlet port 710. A non-reducing ambient, not shown, is provided in the bake chamber 706 by delivering non-reducing gas through the inlet port 708 and extracting it through the outlet port 710.

Figure 8A:
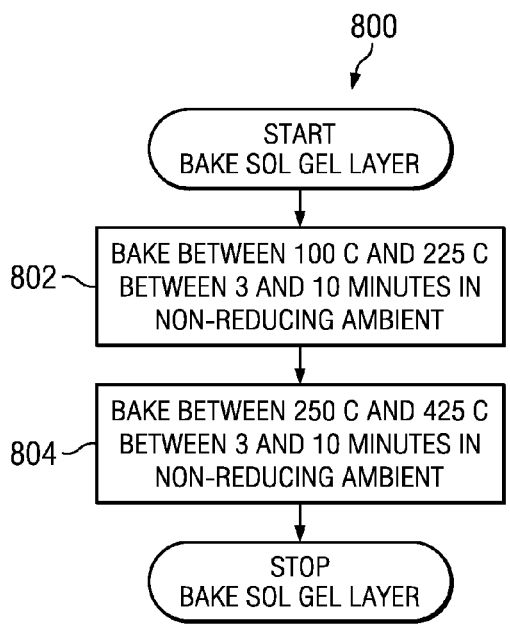
FIG. 8A and FIG. 8B are flowcharts of exemplary embodiments of a sol gel layer bake process performed in the sol gel layer bake apparatus of FIG. 7.
Figure 8B:
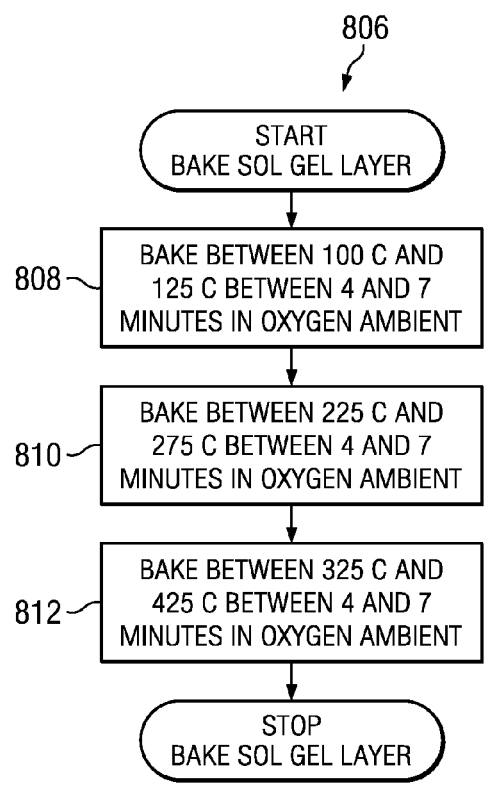

Subsequent to forming the sol gel layer 212, a sol gel bake process is performed prior to annealing the sol gel layer. The bake process is performed in a non-reducing ambient so that a temperature of the sol gel layer 212 increases from a starting temperature between 100° C. and 225° C. to a final temperature between 275° C. and 425° C. and extends at least 2 minutes. The bake process is performed so that at least 90 percent of solvent in the sol gel layer 212 is removed at a rate which does not introduce defects or voids in the sol gel layer 212. Various time-temperature profiles are within the scope of the instant invention. The non-reducing ambient may include at least 1 percent oxygen. FIG. 8A and FIG. 8B are flowcharts of exemplary embodiments of a sol gel layer bake process performed in the sol gel layer bake apparatus 700 of FIG. 7. Referring to FIG. 8A, a first exemplary sol gel layer bake process 800 begins with step 802 to bake the sol gel layer 212 at a temperature between 100° C. and 225° C. for a time between 2 and 10 minutes in a non-reducing ambient. Subsequently, step 804 is to bake the sol gel layer 212 at a temperature between 250° C. and 350° C. for a time between 2 and 10 minutes in a non-reducing ambient.

Referring to FIG. 8B, a second exemplary sol gel layer bake process 806 begins with step 808 to bake the sol gel layer 212 at a temperature between 100° C. and 125° C. for a time between 4 and 7 minutes in an oxygen ambient. Subsequently, step 810 is to bake the sol gel layer 212 at a temperature between 225° C. and 275° C. for a time between 4 and 7 minutes in an oxygen ambient. Subsequently, step 812 is to bake the sol gel layer 212 at a temperature between 325° C. and 425° C. for a time between 4 and 7 minutes in an oxygen ambient.

Figure 9:
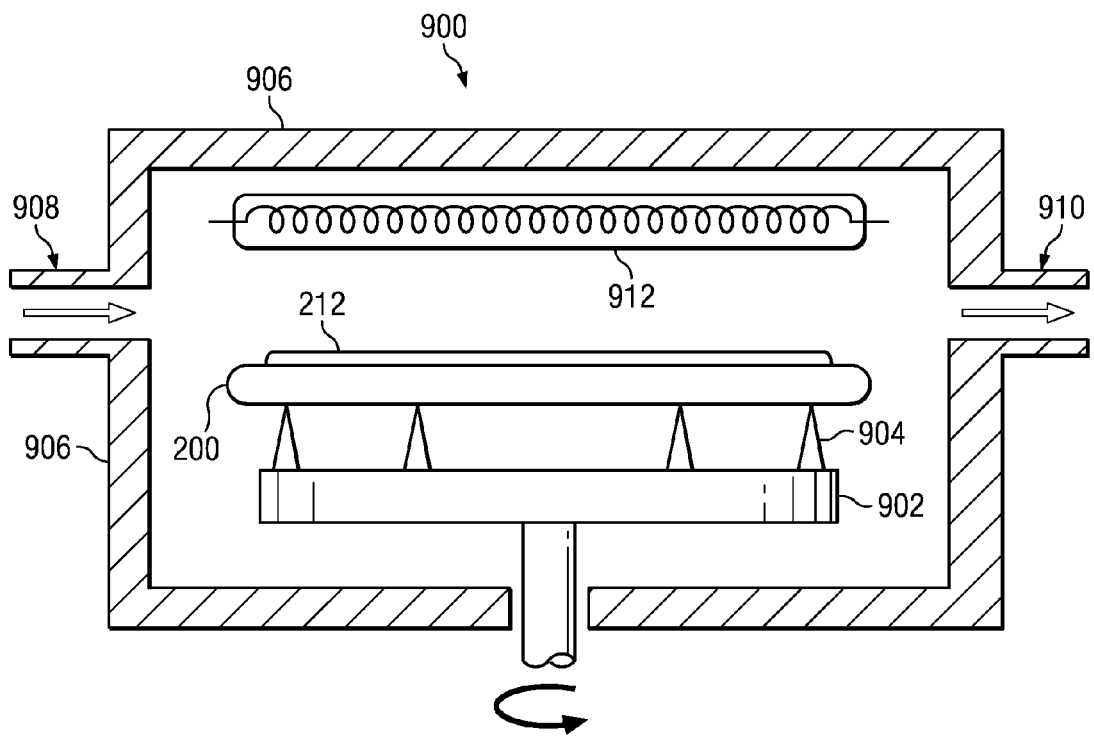
FIG. 9 depicts the wafer in a sol gel layer anneal apparatus.

FIG. 9 depicts the wafer 200 in a sol gel layer anneal apparatus 900. The wafer 200 is disposed over a rotating chuck 902, possibly on standoff pins 904. The anneal apparatus 900 includes an anneal chamber 906 with an inlet port 908 and an outlet port 910. An oxidizing ambient, not shown, is provided in the bake chamber 906 by delivering oxidizing gas through the inlet port 708 and extracting it through the outlet port 910. Heating means 912, for example one or more heating lamps 912 as depicted in FIG. 9, are disposed in the anneal chamber 906.

Figure 10:
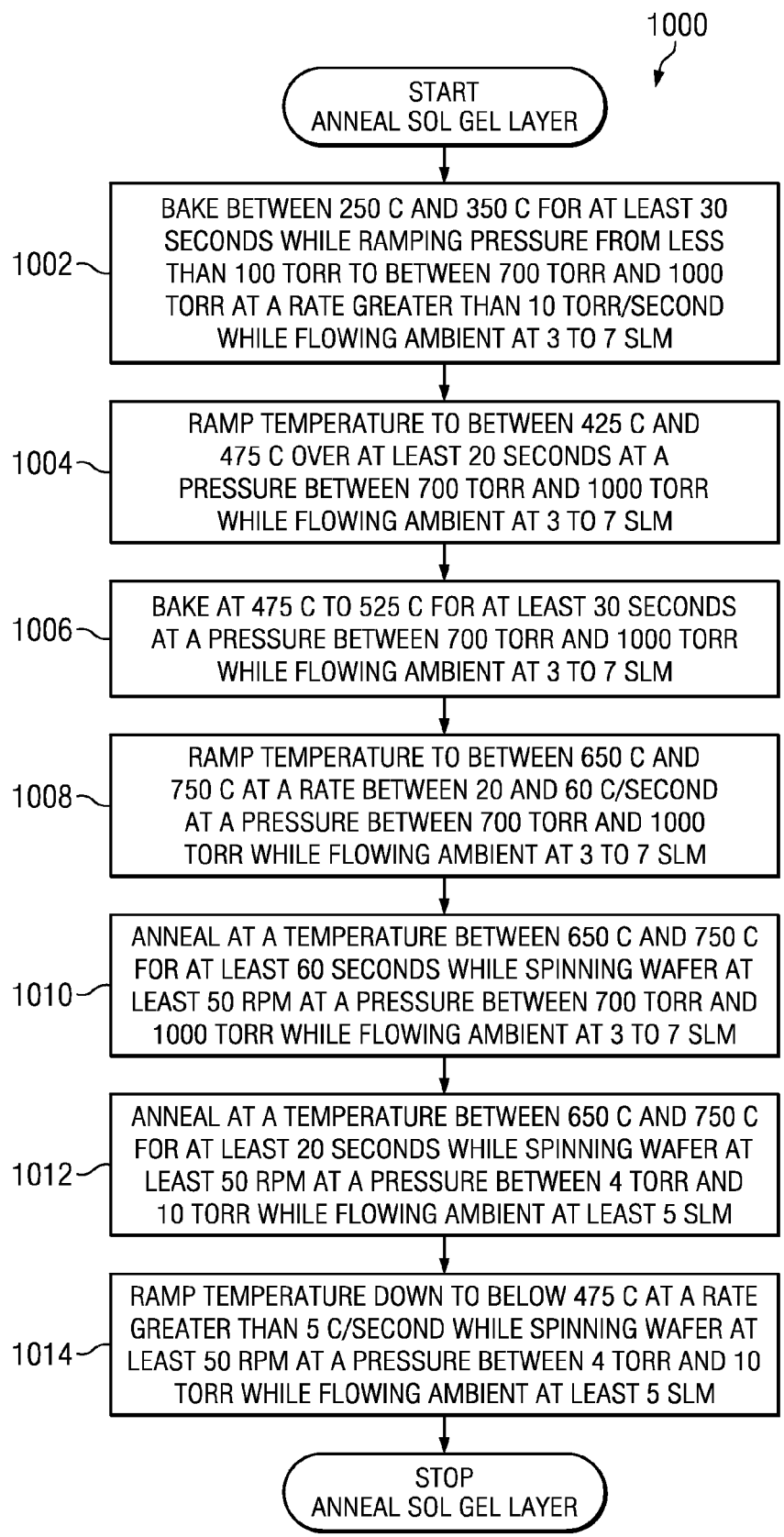
FIG. 10 is a flowchart of an exemplary sol gel anneal process performed in the sol gel layer anneal apparatus of FIG. 9.

FIG. 10 is a flowchart of an exemplary sol gel anneal process 1000 performed in the sol gel layer anneal apparatus 900 of FIG. 9, to be performed in the order depicted in FIG. 10. The anneal process 1000 begins with step 1002 to bake the wafer 200 and sol gel layer 212 at a temperature between 250° C. and 350° C. for at least 30 seconds while ramping a pressure of the oxidizing ambient from less than 100 torr to between 700 torr and 1000 torr at a ramp rate greater than 10 torr per second while flowing an oxidant in the ambient between 3 and 7 standard liters per minute (slm). In one version of the instant embodiment, the pressure of the oxidizing ambient may be ramped at a ramp rate greater than 25 torr per second. In one version of the instant embodiment, the ambient includes at least 95 percent oxygen. In a further version, the ambient includes at least 99 percent oxygen. The wafer may be spun during step 1002, for example between 50 and 125 rpm.

Step 1004 is to ramp up the temperature of the wafer 200 and sol gel layer 212 to between 425° C. and 475° C. over a time period of at least 20 seconds while the ambient pressure is maintained between 700 torr and 1000 torr and the flow rate of the oxidant in the ambient is maintained between 3 and 7 slm. The wafer may be spun during step 1004, for example between 50 and 125 rpm.

Step 1006 is to bake the wafer 200 and sol gel layer 212 at a temperature between 475° C. and 525° C. for at least 30 seconds while the ambient pressure is maintained between 700 torr and 1000 torr and the flow rate of the oxidant in the ambient is maintained between 3 and 7 slm. The wafer may be spun during step 1006, for example between 50 and 125 rpm.

Step 1008 is to ramp up the temperature of the wafer 200 and sol gel layer 212 to between 650° C. and 750° C. at a ramp rate between 20 and 60 degrees C. per minute while the ambient pressure is maintained between 700 torr and 1000 torr and the flow rate of the oxidant in the ambient is maintained between 3 and 7 slm. The wafer may be spun during step 1006, for example between 50 and 125 rpm.

Step 1010 is to anneal the wafer 200 and sol gel layer 212 at a temperature between 650° C. and 750° C. for at least 60 seconds while spinning the wafer 200 between 50 and 125 rpm and while the ambient pressure is maintained between 700 torr and 1000 torr and the flow rate of the oxidant in the ambient is maintained between 3 and 7 slm.

Step 1012 is to anneal the wafer 200 and sol gel layer 212 at a temperature between 650° C. and 750° C. for at least 20 seconds while spinning the wafer 200 between 50 and 125 rpm and while the ambient pressure is maintained between 4 torr and 10 torr and the flow rate of the oxidant in the ambient is at least 5 slm.

Step 1014 is to ramp down the temperature of the wafer 200 and sol gel layer 212 at a ramp rate greater than 5 degrees C. per second to a temperature below 475° C. while spinning the wafer 200 between 50 and 125 rpm and while the ambient pressure is maintained between 4 torr and 10 torr and the flow rate of the oxidant in the ambient is at least 5 slm. In one version of the instant embodiment, the temperature of the wafer 200 and sol gel layer 212 may be ramped down at a ramp rate between 10 degrees C. per second and 25 degrees C. per second.

In an alternate embodiment, a sol gel layer may be annealed in a furnace, so that all the steps of the process 1000 described in reference to FIG. 10 are performed without spinning the wafer.

In one version of the instant embodiment, a PLZT thin film with a lead:lanthanum ratio of 93:7 and a zirconium:titanium ratio of 58:42 may be formed according the embodiment described herein to have a thickness of 400 nanometers of at least 99 percent perovskite phase, with a dielectric constant above 1400, a breakdown voltage above 150 volts and a leakage current density less than $10^{-7}$ amps/cm$^2$.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming a crystalline piezoelectric thin film from an amorphous sol gel layer, comprising the steps of:
   providing an oxidizing ambient to said sol gel layer;
   baking said sol gel layer at a temperature between 250° C. and 350° C. for at least 30 seconds, while ramping a pressure of said oxidizing ambient from less than 100 torr to between 700 torr and 1000 torr at a ramp rate greater than 10 torr per second, and while flowing an oxidant in said ambient between 3 and 7 standard liters per minute (slm);
   ramping up said temperature of said sol gel layer to between 425° C. and 475° C. over a time period of at least 20 seconds, while maintaining said ambient pressure between 700 torr and 1000 torr, and while maintaining said flow rate of said oxidant in said ambient between 3 and 7 slm;
   ramping up said temperature of said sol gel layer to between 650° C. and 750° C. at a ramp rate between 20 and 60 degrees C. per minute, while maintaining said ambient pressure between 700 torr and 1000 torr, and while maintaining said flow rate of said oxidant in the ambient between 3 and 7 slm;
   annealing said sol gel layer at a temperature between 650° C. and 750° C. for at least 60 seconds while spinning said wafer between 50 and 125 rpm, while maintaining said ambient pressure between 700 torr and 1000 torr, and while maintaining said flow rate of said oxidant in said ambient between 3 and 7 slm;
   annealing said sol gel layer at a temperature between 650° C. and 750° C. for at least 20 seconds, while spinning said sol gel layer between 50 and 125 rpm, while maintaining said ambient pressure between 4 torr and 10 torr, and while maintaining said flow rate of said oxidant in said ambient at least 5 slm; and
   ramping down said temperature of said sol gel layer at a ramp rate greater than 5 degrees C. per second, while spinning said sol gel layer between 50 and 125 rpm, while maintaining said ambient pressure between 4 torr and 10 torr, and while maintaining said flow rate of said oxidant in said ambient at least 5 slm.

2. The process of claim 1, in which said piezoelectric film includes lead, zirconium and titanium.

3. The process of claim 1, in which said piezoelectric film includes lead, lanthanum, zirconium and titanium.

4. A process of forming an integrated circuit containing a piezoelectric thin film, comprising the steps of:
   dispensing a first portion of a sol gel solution onto a top surface of a wafer which will contain said integrated circuit;
   spinning said wafer so as to distribute said first portion of said sol gel solution across said top surface of said wafer so as to form a first sol gel layer on said top surface of said wafer;
   drying said first sol gel layer by spinning said wafer in a non-reducing ambient for at least 5 seconds;
   baking said first sol gel layer in a non-reducing ambient, said non-reducing ambient having at least 1 percent relative humidity at 25° C., so that:
      a temperature of said first sol gel layer increases from a starting temperature between 100° C. and 225° C. to a final temperature between 275° C. and 425° C., wherein said baking step extends at least 2 minutes and at least 90 percent of solvent in the first sol gel layer is removed; and
   annealing said first sol gel layer to form said piezoelectric thin film, by a process including the steps of:
      providing an oxidizing ambient to said first sol gel layer;
      baking said wafer and said first sol gel layer at a temperature between 250° C. and 350° C. for at least 30 seconds, while ramping a pressure of said oxidizing ambient from less than 100 torr to between 700 torr and 1000 torr at a ramp rate greater than 10 torr per second, and while flowing an oxidant in said ambient between 3 and 7 standard liters per minute (slm);
      ramping up said temperature of said wafer and said first sol gel layer to between 425° C. and 475° C. over a time period of at least 20 seconds, while maintaining said ambient pressure between 700 torr and 1000 torr, and while maintaining said flow rate of said oxidant in said ambient between 3 and 7 slm;
      ramping up said temperature of said wafer and said first sol gel layer to between 650° C. and 750° C. at a ramp rate between 20 and 60 degrees C. per minute, while maintaining said ambient pressure between 700 torr and 1000 torr, and while maintaining said flow rate of said oxidant in the ambient between 3 and 7 slm;
      annealing said wafer and said first sol gel layer at a temperature between 650° C. and 750° C. for at least 60 seconds while spinning said wafer between 50 and 125 rpm, while maintaining said ambient pressure between 700 torr and 1000 torr, and while maintaining said flow rate of said oxidant in said ambient between 3 and 7 slm;
      annealing said wafer and said first sol gel layer at a temperature between 650° C. and 750° C. for at least 20 seconds, while spinning said wafer between 50 and 125 rpm, while maintaining said ambient pressure between 4 torr and 10 torr, and while maintaining said flow rate of said oxidant in said ambient at least 5 slm; and
      ramping down said temperature of said wafer and said first sol gel layer at a ramp rate greater than 5 degrees C. per second, while spinning said wafer between 50 and 125 rpm, while maintaining said ambient pressure between 4 torr and 10 torr, and while maintaining said flow rate of said oxidant in said ambient at least 5 slm.

5. The process of claim 1, in which said piezoelectric film includes lead, zirconium and titanium.

6. The process of claim 1, in which said piezoelectric film includes lead, lanthanum, zirconium and titanium.

7. The process of claim 1, further including the following steps performed after said step of baking said first sol gel layer and prior to said step of annealing said first sol gel layer:
   dispensing a second portion of a sol gel solution onto a top surface said first sol gel layer;
   spinning said wafer so as to distribute said second portion of said sol gel solution across said top surface of said first sol gel layer so as to form a second sol gel layer on said top surface of said first sol gel layer;
   drying said second sol gel layer by spinning said wafer in a non-reducing ambient for at least 5 seconds; and
   baking said second sol gel layer in a non-reducing ambient, said non-reducing ambient having at least 1 percent relative humidity at 25° C., so that:
      a temperature of said second sol gel layer increases from a starting temperature between 100° C. and 225° C. to a final temperature between 275° C. and 425° C.;
      said baking step of said second sol gel layer extends at least 2 minutes; and
      at least 90 percent of solvent in the second sol gel layer is removed.

8. The process of claim 1, in which said non-reducing ambient of said step of drying said first sol gel layer contains at least 1 percent oxygen.

9. The process of claim 1, in which said non-reducing ambient of said step of baking said first sol gel layer contains at least 1 percent oxygen.

10. The process of claim 1, in which said step of baking said first sol gel layer includes the steps of:
- baking said first sol gel layer in a non-reducing ambient at a temperature between 100° C. and 225° C. for a time period between 2 and 10 minutes; and
- baking said first sol gel layer in a non-reducing ambient at a temperature between 250° C. and 350° C. for a time period between 2 and 10 minutes.

11. The process of claim 1, in which said step of baking said first sol gel layer includes the steps of:
- baking said first sol gel layer in an oxygen ambient at a temperature between 100° C. and 125° C. for a time period between 4 and 7 minutes;
- baking said first sol gel layer in an oxygen ambient at a temperature between 225° C. and 275° C. for a time period between 4 and 7 minutes; and
- baking said first sol gel layer in an oxygen ambient at a temperature between 325° C. and 425° C. for a time period between 4 and 7 minutes.

* * * * *